(12) United States Patent
Jeon et al.

(10) Patent No.: US 7,532,146 B2
(45) Date of Patent: May 12, 2009

(54) MULTI-BIT PIPELINE ANALOG-TO-DIGITAL CONVERTER HAVING MERGED CAPACITOR SWITCHING STRUCTURE

(75) Inventors: Young Deuk Jeon, Daejeon (KR); Seung Chul Lee, Daejeon (KR); Kwi Dong Kim, Daejeon (KR); Chong Ki Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/903,476

(22) Filed: Sep. 20, 2007

(65) Prior Publication Data

US 2008/0129576 A1 Jun. 5, 2008

(30) Foreign Application Priority Data

Nov. 30, 2006 (KR) ...................... 10-2006-0119423

(51) Int. Cl.
*H03M 1/38* (2006.01)
(52) U.S. Cl. ...................... 341/161; 341/155
(58) Field of Classification Search .................. 341/155, 341/156, 118, 120, 161, 172, 122; 250/208, 250/214
See application file for complete search history.

(56) References Cited

U.S. PATENT DOCUMENTS 5,661,483 A 8/1997 Negahban et al.
5,982,221 A * 11/1999 Tuthill ........................ 327/512
6,259,392 B1 7/2001 Choi et al.
6,433,724 B1 8/2002 Confalonieri et al.
6,667,707 B2 12/2003 Mueck et al.
7,009,549 B1 * 3/2006 Corsi ........................ 341/161
7,030,804 B2 * 4/2006 Yoshioka et al. ............ 341/172
7,116,255 B2 10/2006 Lee et al.
7,265,703 B2 * 9/2007 Sasaki et al. ................ 341/161

FOREIGN PATENT DOCUMENTS

| JP | 2000-201077 | 7/2000 |
|---|---|---|
| KR | 2001-0008374 A | 2/2001 |
| KR | 10-2006-0058791 | 6/2006 |

OTHER PUBLICATIONS

Jeon, Young-Deuk, et al., "Acquisition-Time Minimization and Merged-Capacitor Switching Techniques for Sampling-Rate and Resolution Improvement of CMOS ADCs," IEEE International Symposium on Circuits and Systems, Geneva, Switzerland (May 28-31, 2000) pp. III-451-III-454.

* cited by examiner

*Primary Examiner*—Brian Young
(74) *Attorney, Agent, or Firm*—Blakely, Sokoloff, Taylor & Zafman LLP

(57) ABSTRACT

Provided is a multi-bit pipeline analog-to-digital converter (ADC) having a merged capacitor switching structure. In a multiplying digital-to-analog converter (MDAC) used in the multi-bit pipeline ADC, switches are connected between the bottom plates of respective differential capacitors, thereby constantly maintaining a uniform input common mode voltage regardless of an input digital code. Thus, it is possible to improve the operating speed and performance of the MDAC.

4 Claims, 4 Drawing Sheets

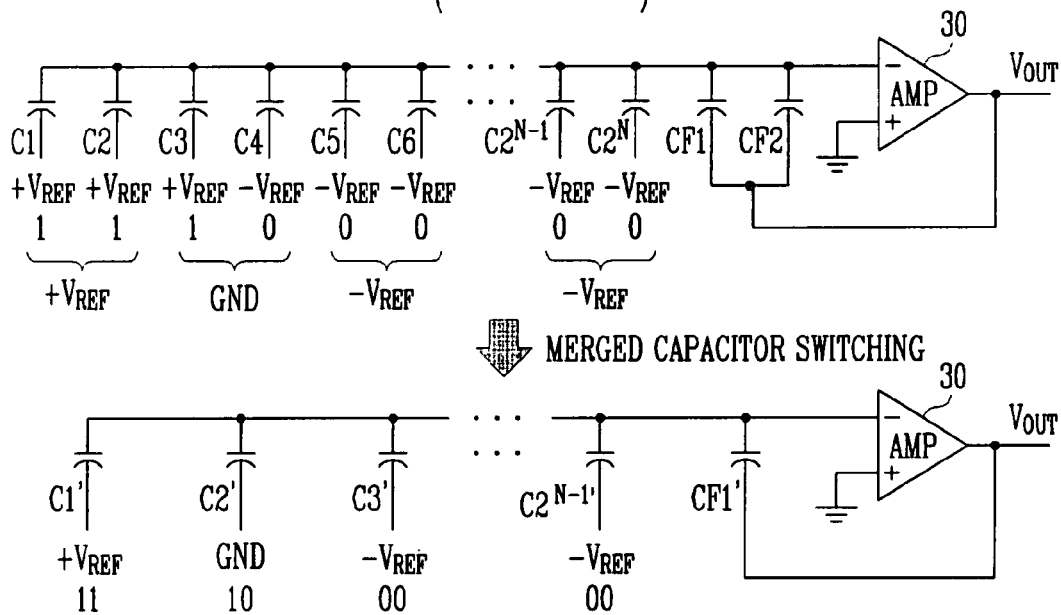
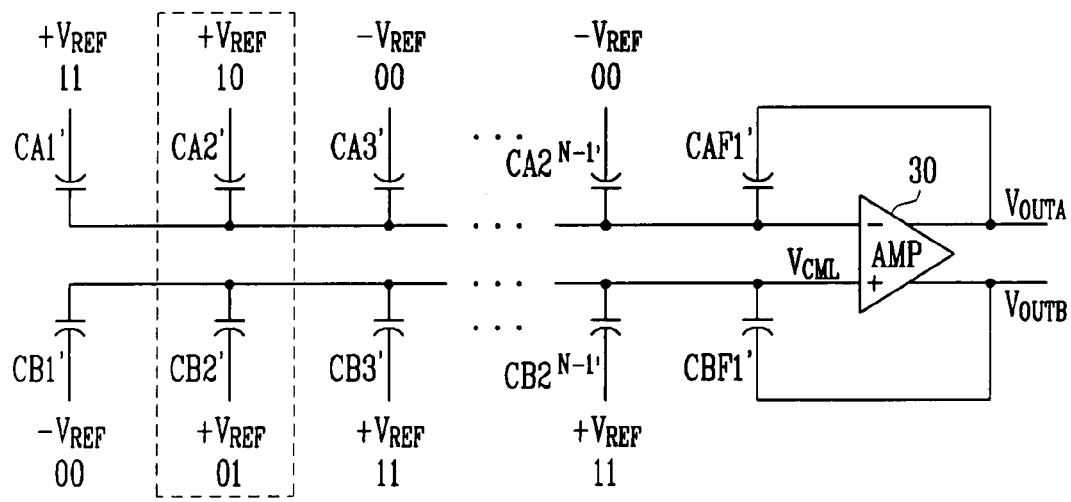
Differential Circuit Implementation

Differential Circuit Implementation

MULTI-BIT PIPELINE ANALOG-TO-DIGITAL CONVERTER HAVING MERGED CAPACITOR SWITCHING STRUCTURE

CROSS-REFERENCE TO RELATED APPLICATION

This application claims priority to and the benefit of Korean Patent Application No. 2006-0119423, filed Nov. 30, 2006, the disclosure of which is incorporated herein by reference in its entirety.

BACKGROUND

1. Field of the Invention

The present invention relates to a multi-bit pipeline analog-to-digital converter (ADC) having a merged capacitor switching structure, and more particularly, to a technique that reduces the number of required capacitors by merging capacitors used in a multiplying digital-to-analog converter (MDAC) of a multi-bit pipeline ADC and can solve the problems of a demand for an additional reference voltage resulting from the merging of capacitors and a change in the input common mode voltage of an amplifier.

2. Discussion of Related Art

In order to process a video signal in an image system, a minute analog signal must be converted into a digital signal insusceptible to noise, which is performed by an ADC.

Video information output from a sensor is very delicate, thus requiring a high-resolution ADC capable of precisely distinguishing a signal. For a communication system and a video processing and application system, such as mobile communication, asynchronous digital subscriber line (ADSL), International mobile telecommunication (IMT)-2000, digital camcorders, high-definition televisions (HDTVs), etc., as well as an image system, a high-performance ADC having a high resolution of 12 bits to 14 bits and a high sampling rate of several tens of megahertz (MHz) is required.

Among well-known conventional ADC structures, flash, folding, subranging and pipeline structures can be used for high-speed signal processing. Recently, among these structures, a multi-bit pipeline structure optimizing speed, power consumption and area is frequently used to satisfy both conditions of high-speed processing and high resolution.

FIG. 1 is a circuit diagram of an MDAC of a conventional multi-bit pipeline ADC.

As illustrated in FIG. 1, a conventional N-bit MDAC using a unit capacitor has a switched-capacitor structure capable of adjusting an amplification factor according to the ratio of a feedback capacitor value and a sampled capacitor value. For such an amplifying operation, the conventional N-bit MDAC comprises $2^N$ sampling capacitors C1 to $C2^N$ 10, two feedback capacitors CF1 and CF2 20, an amplifier 30, an N-bit flash ADC 40, a decoding circuit 50 for adjusting switches according to a digital code, and so on.

As shown in FIG. 1, the mismatch between capacitors limits the resolution by increasing the differential nonlinearity (DNL) of ADCs. A common centroid geometry layout technique generally improves the capacitor match. However, it is difficult to reduce random errors during fabrication.

In order to solve the problem, a merged capacitor switching structure in which two capacitors are merged into one capacitor has been suggested. As described below with reference to FIGS. 2A and 2B, however, in the conventional merged capacitor switching structure, an additional reference voltage is required, or the input common mode voltage of an amplifier is changed.

FIGS. 2A and 2B are circuit diagrams of conventional merged capacitor switching structures.

When the ratio of a sampling capacitor and a feedback capacitor is kept uniform, it is possible to have the same amplification factor as a previous MDAC. According to this, in FIG. 2A, a method is disclosed which reduces the number of required capacitors to the half by merging two feedback capacitors CF1 and CF2 into one CF1' and also merging every two sampling capacitors C1 to $C2^N$ into one C' to $C2^{N-1}$'.

When the number of required capacitors is reduced by merging every two capacitors used in the MDAC into one, two codes generated from the decoding circuit 50 determine the amount of electric charge of the merged capacitors C1' to $C2^{N-1}$'. When the code is "00", it may be simply connected to a reference voltage $-V_{REF}$. And, when the code is "11", it may be simply connected a reference voltage $+V_{REF}$. However, when the code is "10" or "01", an additional reference voltage, e.g., GND or $V_{CML}$, is required because the amount of electric charge stored in the capacitors must be 0 upon generation of the code.

In order to solve such a problem of the additional reference voltage, in FIG. 2B, a method is disclosed which equalizes the amounts of electric charge stored in differential capacitors CA2' and CB2' by applying the same reference voltage $+V_{REF}$ or $-V_{REF}$ to the differential capacitors CA2' and CB2' to which the code "10" or "01" is applied.

According to the method, since the total amount of electric charge stored in the respective differential capacitors increases or decreases depending on a used reference voltage, the input common mode voltage of the amplifier 30 increases when connecting with the reference voltage $+V_{REF}$ or decreases when connecting with the reference voltage $-V_{REF}$ in comparison with a sampled input common mode voltage $V_{CML}$. Therefore, the trans-conductance of the amplifier 30 varies according to the input digital code, thus increasing the settling time of an output signal.

SUMMARY OF THE INVENTION

The present invention is directed to improving the operating speed and performance of a multiplying digital-to-analog converter (MDAC) by connecting switches between bottom plates of respective differential capacitors and uniformly maintaining the input common mode voltage of an amplifier regardless of an input digital code without an additional reference voltage in an MDAC Circuit used in a multi-bit pipeline analog-to-digital converter (ADC).

One aspect of the present invention provides a multi-bit pipeline ADC having a merged capacitor switching structure, comprising a multiplying digital-to-analog converter (MDAC). The MDAC comprises: first and second differential capacitors for storing an analog input voltage and formed by merging a number of sampling capacitors; an amplifier for amplifying a residual voltage passed through the first and second differential capacitors; an N-bit flash ADC connected to an input terminal; and a decoding circuit for controlling the voltage applied to the first and second differential capacitors through first to third switches according to a digital code output from the N-bit flash ADC, wherein when bits of the digital code do not have the same value, the decoding circuit turns on the third switch connected between a bottom plate of the first differential capacitor and a bottom plate of the second differential capacitor and controls the total amount of electric charge stored in the first and second differential capacitors to be 0.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 2A and 2B are circuit diagrams of conventional merged capacitor switching structures;

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1:
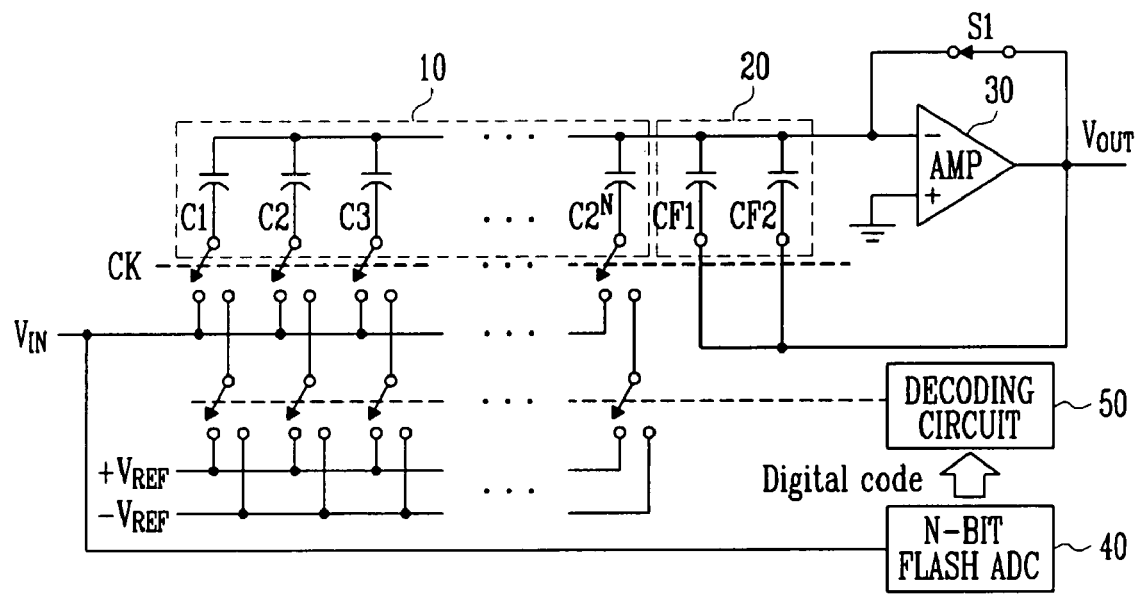
FIG. 1 is a circuit diagram of a multiplying digital-to-analog converter (MDAC) of a conventional multi-bit pipeline analog-to-digital converter (ADC)
Figure 3:
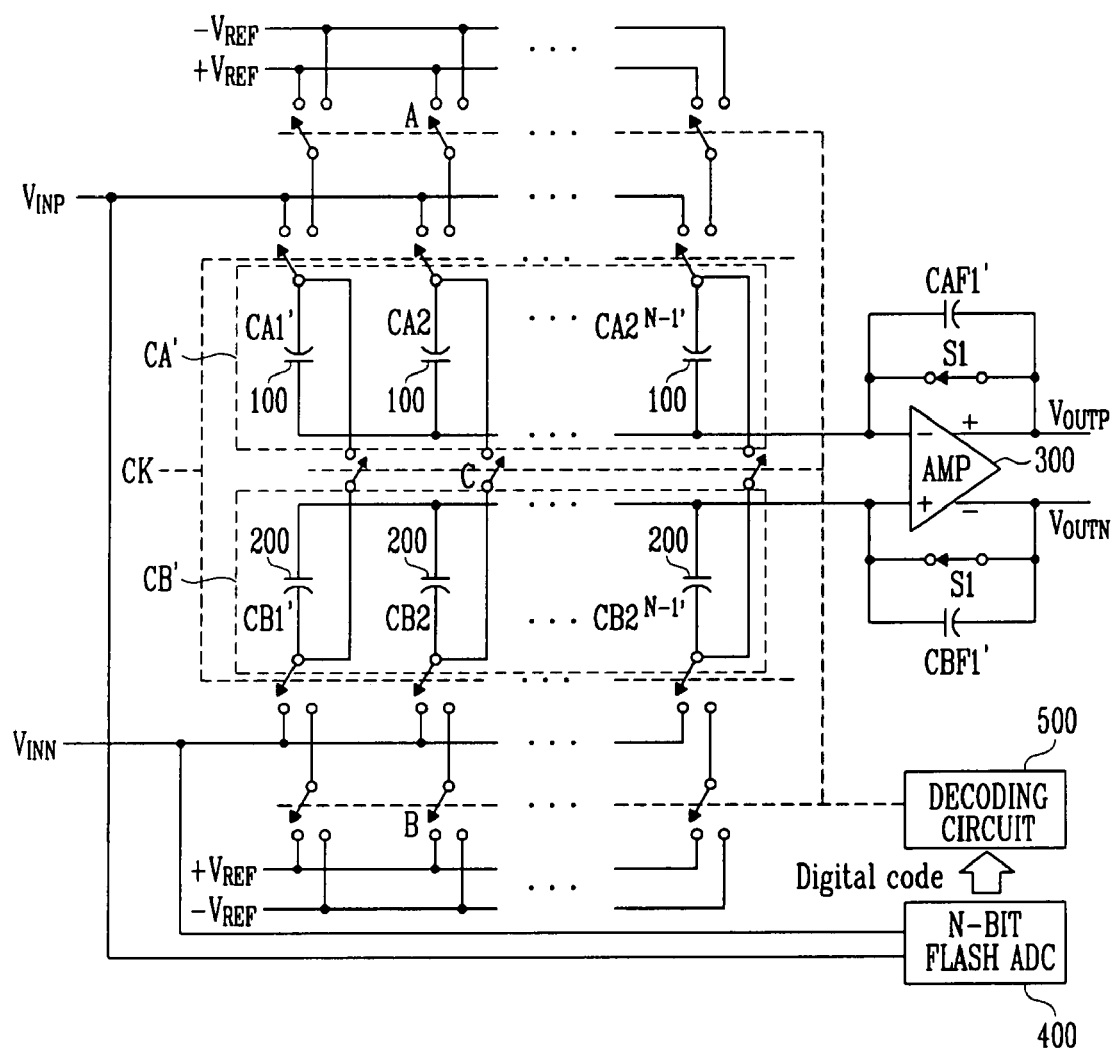
FIG. 3 is a circuit diagram of a differential N-bit MDAC having a merged capacitor switching structure according to an exemplary embodiment of the present invention.
Figure 4:
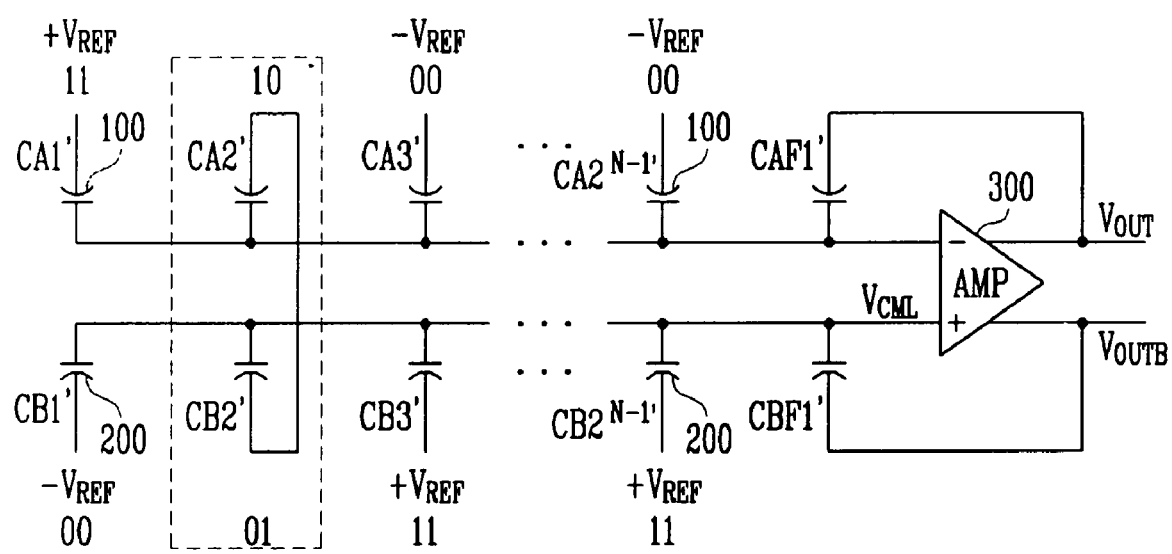
FIG. 4 is a circuit diagram illustrating the operation of the differential N-bit MDAC of FIG. 3.

FIG. 3 is a circuit diagram of a differential N-bit multiplying digital-to-analog converter (MDAC) having a merged capacitor switching structure according to an exemplary embodiment of the present invention, and FIG. 4 is a circuit diagram illustrating the operation of the differential N-bit MDAC of FIG. 3.

As illustrated in FIGS. 3 and 4, the differential N-bit MDAC having a merged capacitor switching structure according to an exemplary embodiment of the present invention comprises first and second differential capacitors 100 and 200, an amplifier 300, an N-bit flash analog-to-digital converter (ADC) 400, and a decoding circuit 500. The first and second differential capacitors 100 and 200 store an analog input voltage and are formed by merging a number of sampling capacitors. The amplifier 300 amplifies and outputs residual voltages passed through the first and second differential capacitors 100 and 200. The N-bit flash ADC 400 is connected to an input terminal. The decoding circuit 500 controls the voltage applied to the first and second differential capacitors 100 and 200 through first to third switches A, B and C according to a digital code output from the N-bit flash ADC 400.

For convenience, the first differential capacitor 100 comprising a number of sampling capacitors $CA1'$ to $CA2^{N-1'}$ in the upper part is referred to as CA', and the second differential capacitor 200 comprising a number of sampling capacitors $CB1'$ to $CB2^{N-1'}$ in the lower part is referred to as CB'.

As described above, when capacitors used in an MDAC circuit are merged, an additional reference voltage may be required, or the input common mode voltage of an amplifier may be changed. In order to solve this problem, according to the present invention, as described below, a switch C is connected between the bottom plate of the first differential capacitor CA' 100 and that of the second differential capacitor CB' 200, so that uniform input common mode voltage can be constantly maintained according to switching control of the decoding circuit 500 regardless of an input digital code. This will be described in detail below.

First, the decoding circuit 500 controls the first to third switches A, B and C according to the digital code applied from the N-bit flash ADC 400 as shown in Table 1:

TABLE 1

| Applied code | A | B | C |
|---|---|---|---|
| 00 | $-V_{REF}$ | $+V_{REF}$ | OFF |
| 01 | OFF | OFF | ON |
| 11 | $+V_{REF}$ | $-V_{REF}$ | OFF |

To be specific, when a code "00" is applied, the decoding circuit 500 controls the first switch A to connect the first differential capacitor CA' 100 to a reference voltage $-V_{REF}$ and controls the second switch B to connect the second differential capacitor CB' 200 to a reference voltage $+V_{REF}$.

On the other hand, when a code "11" is applied, the decoding circuit 500 controls the first switch A to connect the first differential capacitor CA' 100 to the reference voltage $+V_{REF}$ and controls the second switch B to connect the second differential capacitor CB' 200 to the reference voltage $-V_{REF}$.

When the code "00" or "11" is applied, the third switch C is turned off.

Meanwhile, when a code "01" or "10" is applied, i.e., bits of the digital code applied from the N-bit flash ADC 400 do not have the same value, the decoding circuit 500 turns off the first and second switches A and B connected to the reference voltages $\pm V_{REF}$ and turns on the third switch C, thereby connecting the bottom plate of the first differential capacitor CA' 100 with that of the second differential capacitor CB' 200.

When the bottom plate of the first differential capacitor CA' 100 is connected with that of the second differential capacitor CB' 200 in this way, two input nodes of the amplifier 300 maintain the same voltage $V_{CML}$ due to the high DC gain of the amplifier 300. In addition, charge sharing occurs between the differential capacitors 100 and 200 to which differential input signals are input, and thus the total amount of electric charge stored in the differential capacitors 100 and 200 becomes 0. Consequently, the total amount of electric charge stored in the differential capacitors 100 and 200 is not changed, thus uniformly maintaining the input common mode voltage.

In this way, the differential N-bit MDAC circuit employing a merged capacitor switching technique according to an exemplary embodiment of the present invention can uniformly maintain the input common mode voltage of the amplifier without an additional reference voltage. Thus, it can improve the operating speed and performance of the MDAC by constantly maintaining the uniform input common mode voltage regardless of the input digital code.

Meanwhile, the technique of equalizing the amounts of capacitors by appropriately controlling the three switches A, B and C without an additional reference voltage as described above may be applied to various switched capacitor structures.

As described above, according to the present invention, switches are connected between bottom plates of respective differential capacitors in an MDAC circuit of a multi-bit pipeline ADC, thereby uniformly maintaining the input common mode voltage of an amplifier without an additional reference voltage. Thus, the operating speed and performance of an MDAC can be improved by constantly maintaining the uniform input common mode voltage regardless of an input digital code While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multi-bit pipeline analog-to-digital converter (ADC) having a merged capacitor switching structure, comprising a multiplying digital-to-analog converter (MDAC) including:

first and second differential capacitors for storing an analog input voltage and formed by merging a number of sampling capacitors;

an amplifier for amplifying a residual voltage passed through the first and second differential capacitors;

an N-bit flash ADC connected to an input terminal; and a decoding circuit for controlling the voltage applied to the first and second differential capacitors through first to third switches according to a digital code output from the N-bit flash ADC, wherein when bits of the digital code do not have the same value, the decoding circuit turns off the first and second switches connected to positive and negative reference voltages $\pm V_{REF}$ and turns on the third switch connected between a bottom plate of the first differential capacitor and a bottom plate of the second differential capacitor and controls the total amount of electric charge stored in the first and second differential capacitors to be 0.

2. The multi-bit pipeline ADC of claim 1, wherein when the total amount of electric charge stored in the first and second differential capacitors becomes 0, an input common mode voltage of the amplifier is kept uniform.

3. The multi-bit pipeline ADC of claim 1, wherein when the bits of the digital code have the same value, the decoding circuit turns on the first and second switches, applies positive and negative reference voltages $\pm V_{REF}$ to the first and second differential capacitors, respectively, and turns off the third switch.

4. The multi-bit pipeline ADC of claim 1, further comprising a third differential capacitor formed by merging a number of feedback capacitors.

* * * * *